US006884684B2

(12) United States Patent
Huang et al.

(10) Patent No.: US 6,884,684 B2
(45) Date of Patent: Apr. 26, 2005

(54) HIGH DENSITY TRENCH POWER MOSFET STRUCTURE AND FABRICATION METHOD THEREOF

(75) Inventors: Lin-Chung Huang, Hsinchu (TW); Keh-Yuh Yu, Hsinchu (TW)

(73) Assignee: Advanced Power Electronics Corp. (TW)

( * ) Notice: Subject to any disclaimer, the term of this patent is extended or adjusted under 35 U.S.C. 154(b) by 101 days.

(21) Appl. No.: 10/429,792

(22) Filed: May 6, 2003

(65) Prior Publication Data

US 2004/0175889 A1 Sep. 9, 2004

(30) Foreign Application Priority Data

Mar. 6, 2003 (TW) ........................................ 92104858 A

(51) Int. Cl.[7] ...................... H01L 21/336; H01L 31/113
(52) U.S. Cl. .................... 438/270; 438/589; 257/329
(58) Field of Search ................................. 257/327–330; 438/268–273, 589, 138

(56) References Cited

U.S. PATENT DOCUMENTS 6,015,737 A * 1/2000 Tokura et al. ............... 438/270
6,198,127 B1 * 3/2001 Kocon ......................... 257/328

* cited by examiner

Primary Examiner—Matthew Smith
Assistant Examiner—Calvin Lee
(74) Attorney, Agent, or Firm—Hoffman Wasson & Gitler

(57) ABSTRACT

A high density trench power-MOSFET is described in the present invention. The power-MOSFET has a substrate, first and second epi-layers sequentially formed over the substrate and a trench type gate electrode. A silicon nitride layer is formed over the gate electrode to prevent an electrical connecting between the gate electrode and the metal layer formed in a later process.

21 Claims, 4 Drawing Sheets

HIGH DENSITY TRENCH POWER MOSFET STRUCTURE AND FABRICATION METHOD THEREOF

FIELD OF THE INVENTION

The present invention relates to a semiconductor device and fabrication method thereof, and more specifically, to a high power semiconductor and fabrication method thereof.

BACKGROUND OF THE INVENTION

The bipolar junction transistor (BJT) is the most important semiconductor device. This kind of device can be used in a high-speed logic circuit as a high power device. However, this device consumes a lot of power during operation. Therefore, the BJT has been replaced with the MOSFET in high-speed logic circuits to conserve power.

Generally, operation of the power-MOSFET is same as the operation of a typical MOSFET. However, the power-MOSFET can accept the larger current than a typical MOSFET. The voltage between the source electrode and the drain electrode of a power-MOSFET is about 20 to 1200 volts. The input impedance in the gate electrode of a power-MOSFET is large. Therefore, when a control voltage is applied to the gate electrode, the gate current can be kept low. In other words, it is only necessary to use a small control voltage to switch the power-MOSFET.

Reference is made to FIG. 1, a cross-sectional view of a conventional power-MOSFET. An N-type epi-layer 112 is deposited over a heavily doped N-type (or P-type) semiconductor substrate 100. Then, a poly-silicon gate layer 110 is defined over the N-type epi-layer 112. Two lightly doped P-well regions 108 are formed in the N-type epi-layer 112 as the channel region of the power-MOSFET. Two heavily doped N-well regions 114 are respectively formed in the two lightly doped P-well regions 108 as the source regions of the power-MOSFET. Finally, two metal layers 104 are respectively formed over the two heavily doped N-well regions 114 as the contact regions 102 and 104 with the source regions.

In accordance with the device depicted in the FIG. 1, the heavily doped N-well region 114 is the source region. The lightly doped P-well region 108 is the channel region. The heavily doped N-type semiconductor substrate 100 is the drain region. During operation, the electrons start from the source region and transversely pass through the inverse layer under the gate electrode to reach the N-type epi-layer 112. Then, the electrons can vertically pass through the he N-type epi-layer 112 to reach the drain electrode 100. Therefore, a wider channel region can raise the operation speed of a power-MOSFET. However, the wider channel region also increases the device size.

On the other hand, the conventional device structure is easily affected by a shift of the photolithography process, even if the shift is very small. Reducing the influence of the photolithography process is therefore highly desirable.

SUMMARY OF THE INVENTION

In accordance wit the above description, although a wider channel region increases the operation speed of a power-MOSFET, the wider channel region also increases the device size. On the other hand, the alignment in the photolithography process is more difficult when the device size is reduced. However, a bad photolithography process can influence the electrical performance of the final product.

Therefore, a main object of the present invention is to provide a high-density trench power-MOSFET structure and fabrication method thereof. A trench-type gate structure is formed between the source region and the drain region to increase the current carrying capacity.

It is another object of the present invention to provide a high-density trench power-MOSFET structure and fabrication method thereof. An insulating layer is formed over the trench structure to reduce the requirement of the design rule. Therefore, the density of the semiconductor device may be increased.

Therefore, the present invention provides a high-density trench power-MOSFET structure and fabrication method thereof. First, a heavily doped N-type semiconductor substrate is used as the drain electrode region. Next, an N-type epi-layer and a P-type epi-layer are sequentially deposited over the semiconductor substrate. A photo-resist layer is used to define a gate electrode region. Then, the semiconductor substrate is etched to form a trench in the N-type epi-layer and the P-type epi-layer by using the photo resist as an etching mask. A gate oxide layer is next formed on an outer surface of the trench structure. The trench structure is filled with a doped polysilicon layer, such that a top surface of the doped polysilicon layer is lower than a top surface of the substrate. A silicon nitride layer is deposited on the surfaces of the doped polysilicon layer. The surface of the silicon nitride layer and the surface of the semiconductor substrate form a plane. Two doped regions having opposite electricity are formed in the semiconductor substrate, in which the doped region adjacent to the trench structure is the source electrode and another doped region is the body region. Finally, a dielectric layer is formed on the surface of the semiconductor substrate.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, a high-density trench power transistor structure and fabrication method thereof proposed in the present invention are illustrated with one preferred embodiment. One of ordinary skill in the art, upon acknowledging the embodiment, can apply the structure and manufacturing method of the present invention to various power transistors. In accordance with the present invention, a trench-type gate structure is formed between the source region and the drain region to increase the carrying current capacity. On the other hand, an insulating layer is formed over the trench structure to reduce the requirements of the design rule. Therefore, the density of the semiconductor device can be increased. The application of the present invention is not limited by the preferred embodiments described in the following.

Figure 1:
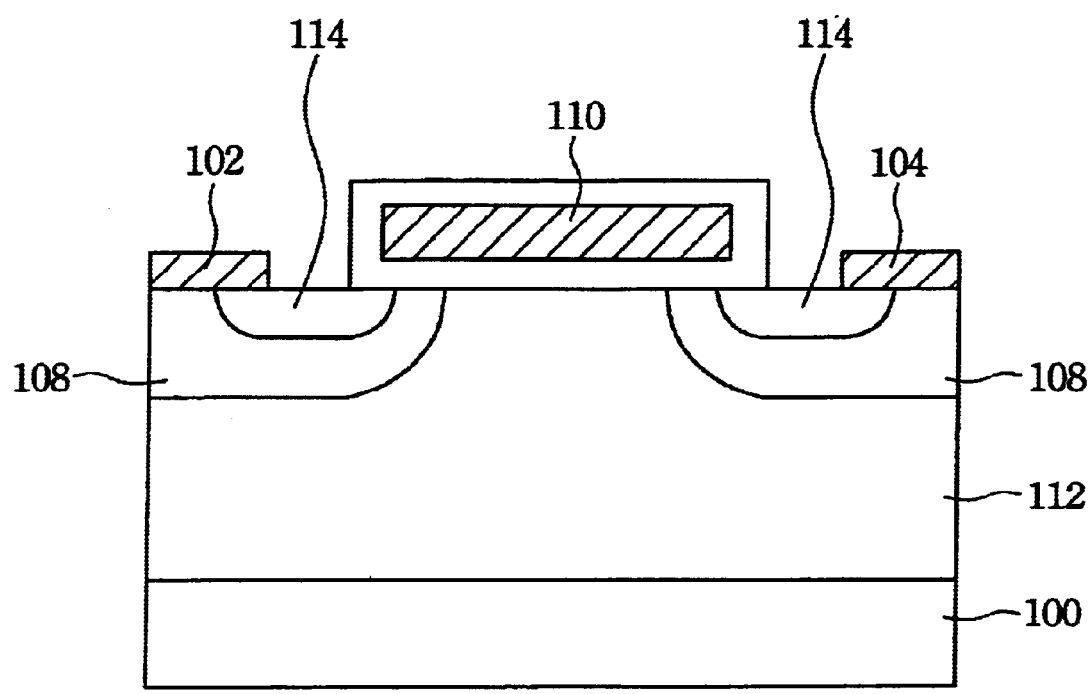
FIG. 1 is a cross-sectional view of a conventional power-MOSFET.
Figure 2:
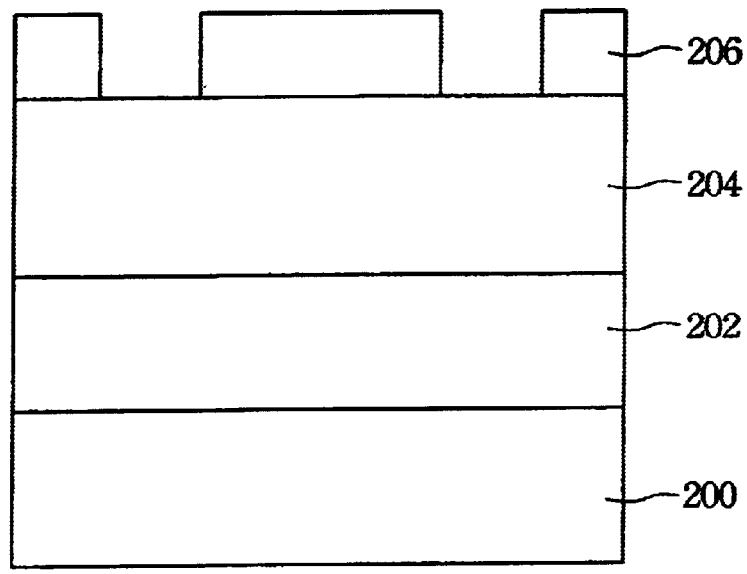
FIG. 2 is a cross-sectional view of a semiconductor wafer illustrating the steps of sequentially forming an N-type epi-layer and a P-type epi-layer over an N-type semiconductor substrate and using a photo-resist layer to define a gate electrode region in accordance with the present invention.

Referring to FIG. 2, a cross-sectional view of a semiconductor wafer in accordance with the present invention is shown. An N-type epi-layer 202 is formed over an N-type or P-type semiconductor substrate 200 as the drain region, in which said N-type epi-layer 202 is a silicon epi-layer. The concentration of the N-type epi-layer 202 is about $10^{13}$ to $10^{15}$ cm$^3$ in accordance with the preferred embodiment. Next, a P-type body layer 204 is formed over the N-type epi-layer 202, in which said P-type body layer is a silicon epi-layer. As is known in the art, the N-type epi-layer 202 can be formed by chemical vapor deposition (CVD). The P-type body layer 204 can be formed by an ion implantation method and dopant diffusion method. Next, a patterned photo-resist layer 206 is formed over the P-type body layer 204 to expose partially the surface region of the body region 204 for defining a trench structure in a later procedure.

Subsequently, an etching step is performed to etch the P-type body layer 204 and the N-type epi-layer 202 by using the patterned photo-resist layer 206 as an etching mask for forming a trench structure 208 on the semiconductor substrate 200. In a preferred embodiment, a reactive ion etching (RIE) step is used to form the trench structure 208 as shown in the FIG. 3. Finally, the patterned photo-resist layer 206 is removed.

Figure 3:
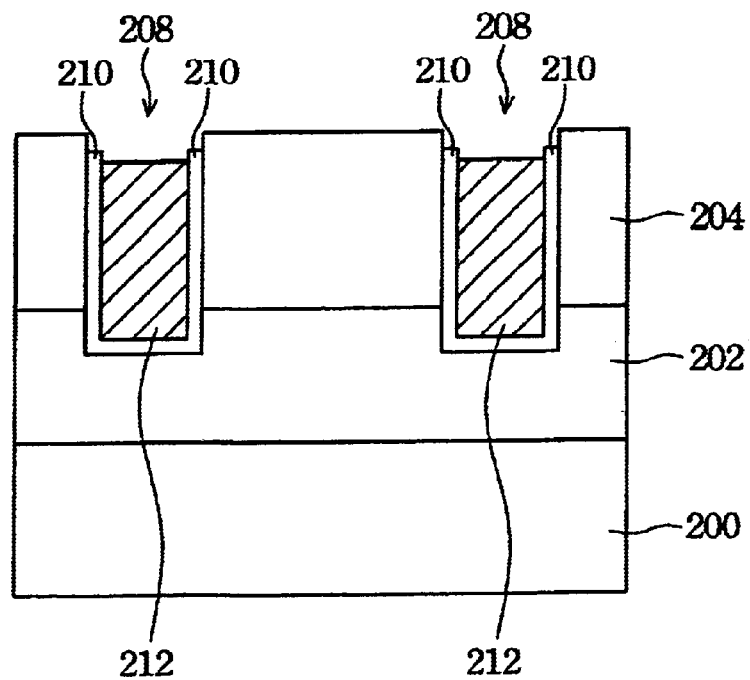
FIG. 3 is a cross-sectional view of a semiconductor wafer illustrating the steps of forming a trench-type gate structure and doped polysilicon layer in the trench structure in accordance with the present invention.

Refer to FIG. 3, a thin gate oxide layer 210 is formed on the outer surface of the trench structure 208. In the preferred embodiment, the gate oxide layer 210 with a thickness approximately in the hundreds to thousands of angstroms is formed by performing a thermal oxidization procedure in an oxygen-steam ambient. Thermal oxidation is performed at a temperature of between about 700° C. to 1100° C. Then, a doped polysilicon layer 212 is formed to fill the trench structure 208 as the trench gate structure of the power transistor manufactured in a later process.

Generally, a doped polysilicon layer is firstly formed on the substrate 200 and the trench structure 208 is filled therewith. An etching step is then performed to remove the doped polysilicon layer above the P-type body layer 204 and to make the top surface of the residual doped polysilicon layer 212 and the gate oxide layer 210 lower than the P-type body layer 204, in which the doped polysilicon layer 212 is used as a gate electrode. The doped polysilicon layer 212 with a recessed top surface is illustrated in FIG. 3. It is noted that other conducting materials can be chosen to form the doped polysilicon layer 212, in which the conducting materials comprise in-situ doped polysilicon, copper, aluminum, tungsten, titanium, platinum and alloy.

Figure 4:
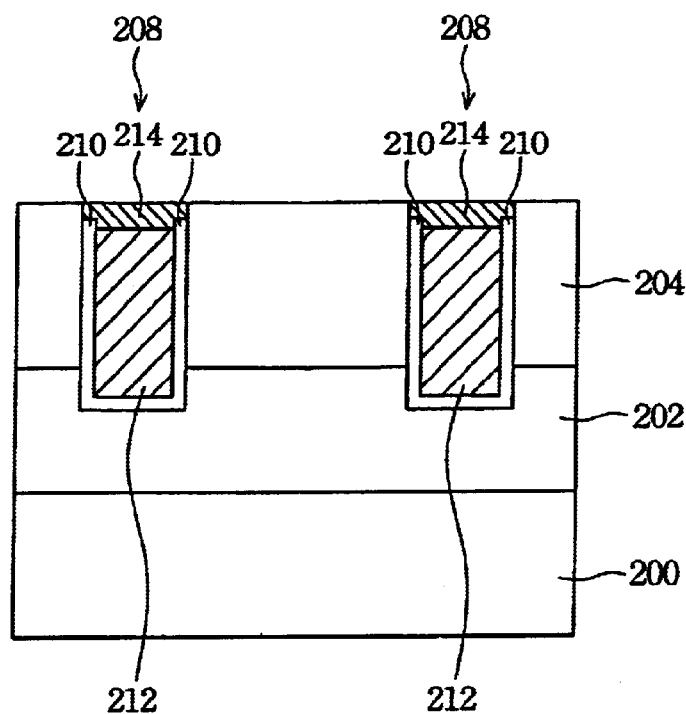
FIG. 4 is a cross-sectional view of a semiconductor wafer illustrating the steps of forming a silicon nitride layer over the doped polysilicon layer in accordance with the present invention.
Figure 5:
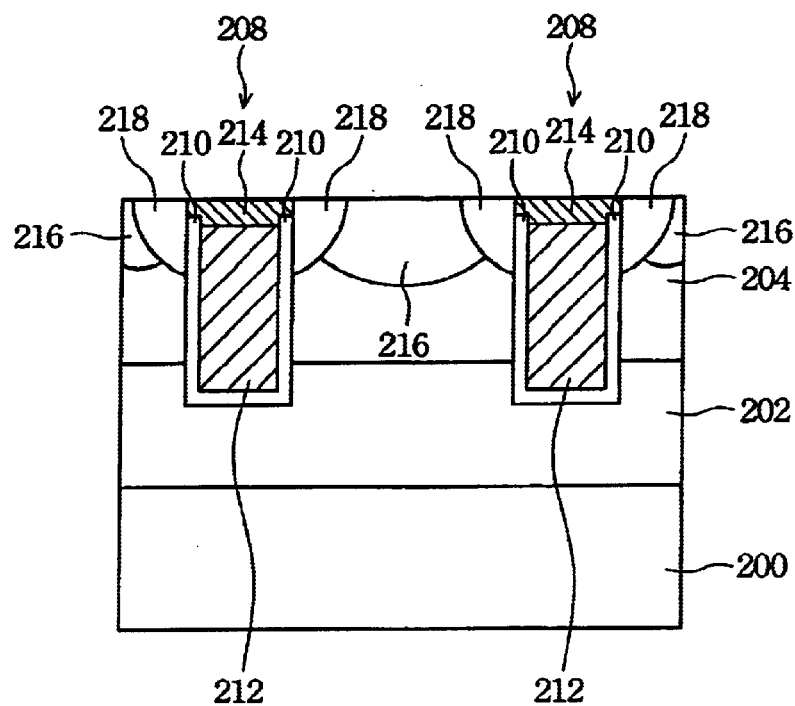
FIG. 5 is a cross-sectional view of a semiconductor wafer illustrating the steps of forming a source region and body region in the P-type epi-layer in accordance with the present invention.

Referring to FIG. 4, a silicon nitride layer 214 with a thickness of about 1000 angstroms is formed over the doped polysilicon layer 212 and the gate oxide layer 210 to serve as the etching stop layer in a later process. In a general, the silicon nitride layer 214 can be formed by using an appropriate method, such as Low Pressure Chemical Vapor Deposition (LPCVD), Plasma Enhanced Chemical Vapor Deposition (PECVD), and so on. Further, in the preferred embodiment, the reaction gases used to form the second nitride layer 116 are SiH$_4$, NH$_3$, N$_2$, N$_2$O or SiH$_2$Cl$_2$, NH$_3$, N$_2$, N$_2$O.

Then, a etch back process is performed on the silicon nitride layer 214 to remove the silicon nitride layer located over the P-type body layer 204 and to expose the top surface of the P-type body layer 204. At this time, the silicon nitride layer 214 fills the recessed top surface of the doped polysilicon layer 212 to form a common plane with the top surface of the P-type body layer 204. The silicon nitride layer 214 covers the outer surface of the doped polysilicon layer 212. In a preferred embodiment, a reactive ion etching (RIE) step is used to etch the silicon nitride layer 214, and the etchant used to etch the silicon nitride layer 214 comprises CF$_4$/H$_2$, CHF$_3$ and CH$_3$CHF$_2$.

Next, a patterned photo-resist layer (not shown in the figure) is formed for the P-type deep body region 216. The deep body region 216 is formed by an ion implantation process and a dopant diffusion process while using the patterned photo-resist layer as a mask. The deep body region 216 is formed in the P-type body layer 204. The temperature of the dopant diffusion process is between about 500° C. and 2000° C. The dopant material is boron and the dopant concentration is between about $10^{15}$ and $7 \times 10^{15}$/cm$^3$. Finally, the patterned photo-resist layer is removed.

Next, another patterned photo-resist layer is formed for forming the source region. A doped region is formed by ion implantation in the P-type body layer 204 as the source region while using the patterned photo-resist layer as a mask. The doped region, source region 218, is next to the gate oxide layer 210 and the sidewall of the trench structure 208. The implant concentration of the source region 218 is between about $10^{15}$ and $7 \times 10^{15}$/cm$^3$. Moreover, the polarities of the source region 218 and the deep body region 216 are opposite.

Figure 6:
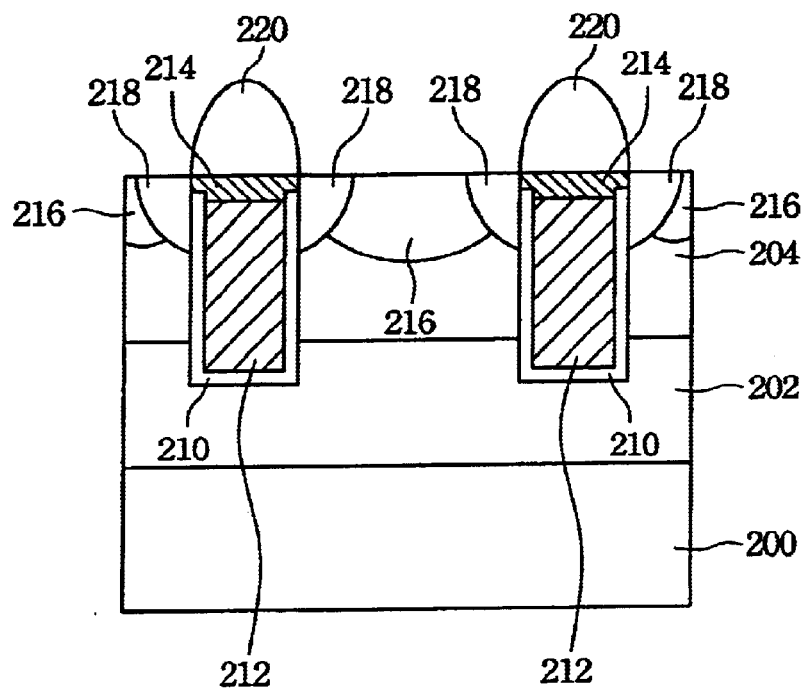
FIG. 6 is a cross-sectional view of a semiconductor wafer illustrating the steps of forming a dielectric layer over the silicon nitride layer in accordance with the present invention.

Referring to FIG. 6, a dielectric layer 220 is formed to cover the silicon nitride layer 214 and the P-type body layer 204. The material of the dielectric layer 220 can be a Phosphosilicate Glass (PSG) formed by Atmospheric Pressure Chemical Vapor Deposition (APCVD) or a Borophosphosilicate Glass (BPSG) formed by Plasma Enhanced Chemical Vapor Deposition (PECVD). Next, a patterned photo-resist layer (not shown in the figure) is formed over the dielectric layer 220. An etching process is performed to expose the surface of the source region 218 and the deep body region 216 by using this patterned photo-resist layer as a mask.

Figure 7:
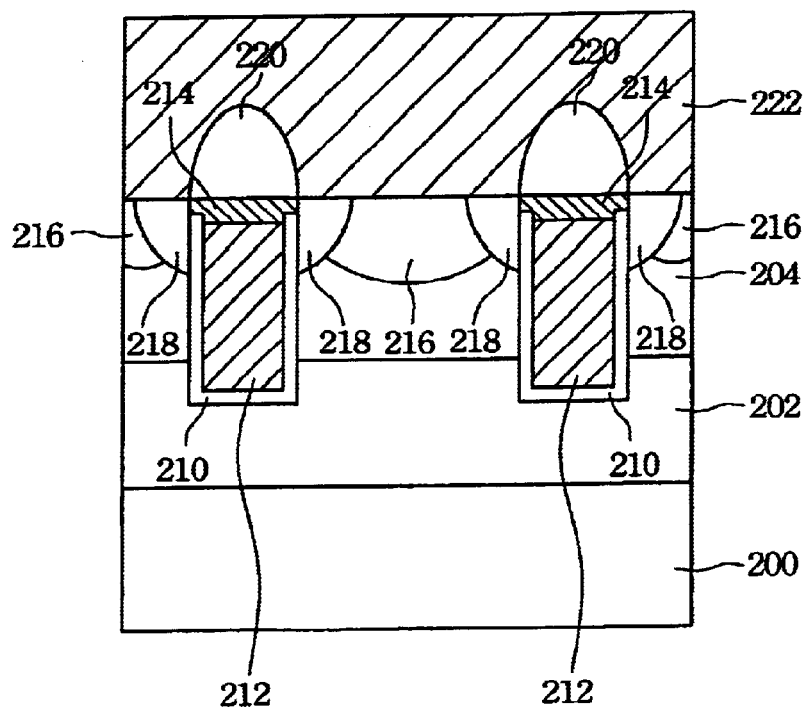
FIG. 7 is a cross-sectional view of a power-MOSFET in accordance with the present invention.

Referring to FIG. 7, a metal layer 222 is formed over the surfaces of the dielectric layer 220, the source region 218 and the deep body region 216.

When operating the power transistor of the present invention, an electric field is first applied to the trench-type gate structure 212. This electric field can lead out an inverse layer in the P-type body layer 204. At this time, the electrons can flow from the source region 218 to the drain region 202 through the inverse layer.

On the other hand, a silicon nitride layer 214 is formed on and covers the doped polysilicon layer 212. Therefore, when performing the contact etching, the silicon nitride layer 214 can be used as a stop layer. In other words, the silicon nitride layer 214 can avoid contact between the doped polysilicon layer 212 and the metal layer 222. The alignment process can be performed along the edge of the gate electrode structure. On the other hand, the electrical performance of the final product is not influenced even though the dielectric layer 222 does not perfectly cover the doped polysilicon layer 212.

As is understood by a person skilled in the art, the foregoing preferred embodiments of the present invention are illustrative of the present invention rather than limiting of the present invention. It is intended that this description cover various modifications and similar arrangements included within the spirit and scope of the appended claims, the scope of which should be accorded the broadest interpretation so as to encompass all such modifications and similar structure.

What is claimed is:

1. A method of forming a high-density trench power-MOSFET structure, said method comprising the following steps of:

forming a first dielectric layer on a substrate, wherein said first dielectric layer and said substrate are identical in polarity;

forming a second dielectric layer on said first dielectric layer, wherein said first dielectric layer and said second dielectric layer have are opposite in polarity;

forming a trench structure in the substrate/first dielectric layer/second dielectric layer combination structure, wherein said trench structure penetrates said second dielectric layer;

forming a gate oxide layer on an outer surface of said trench structure;

forming a first conducting layer to fill said trench structure to serve as a gate structure, wherein a top surface of said first conducting layer is lower than a top surface of said second dielectric layer;

forming a third dielectric layer on said gate structure, wherein a top surface of said third dielectric layer and a top surface of said second dielectric layer form a plane;

forming a first doped region in said second dielectric layer to serve as a deep body region, wherein said first doped region and said second dielectric layer are identical in polarity;

forming a second doped region in said second dielectric layer to serve as a source region, wherein said second doped region is next to sidewalls of said trench structure and said second doped region and said first dielectric layer are identical in polarity;

forming a fourth dielectric layer to cover said third dielectric layer; and forming a second conducting layer on said fourth dielectric layer and said second dielectric layer.

2. The method of claim 1, wherein the polarity of said substrate is N-type or P-type.

3. The method of claim 1, wherein said first dielectric layer is a silicon layer and the polarity of said first dielectric layer is N-type or P-type.

4. The method of claim 1, wherein said second dielectric layer is a silicon layer and the polarity of said first dielectric layer is N-type or P-type.

5. The method of claim 1, wherein said substrate is serves as a drain structure of said trench power-MOSFET.

6. The method of claim 1, wherein said first conducting layer is doped polysilicon, in-situ doped polysilicon, aluminum, copper, tungsten, titanium, platinum or an alloy.

7. The method of claim 1, wherein said third dielectric layer is a silicon-nitride layer.

8. The method of claim 1, wherein said fourth dielectric layer is a Phosphosilicate Glass (PSG) or a Borophosphosilicate Glass (BPSG).

9. The method of claim 1, wherein the dopant polarity of said first doped region and second doped region is N-type or P-type.

10. The method of claim 1, wherein a concentration of said first doped region is between about $10^{15}$ and $7 \times 10^{15}/cm^3$.

11. The method of claim 1, wherein a concentration of said second doped region is between about $10^{15}$ and $7 \times 10^{15}/cm^3$.

12. A high-density trench power-MOSFET structure, said structure comprising:

a first dielectric layer located on a substrate, wherein said first dielectric layer and said substrate are identical in polarity;

a second dielectric layer locating on said first dielectric layer, wherein said first dielectric layer and said second dielectric layer are opposite in polarity;

a trench structure located in the substrate/first dielectric layer/second dielectric layer combination structure, wherein said trench structure penetrates said second dielectric layer;

a gate oxide layer located on an outer surface of said trench structure;

a first conducting layer filling said trench structure to serve as a gate structure, wherein a top surface of said first conducting layer is lower than a top surface of said second dielectric layer;

a third dielectric layer locating on said gate structure, wherein a top surface of said third dielectric layer and a top surface of said second dielectric layer form a plane;

a doped region next to sidewalls of said trench structure to serve as a source region, wherein said doped region and said first dielectric layer are identical in polarity;

a fourth dielectric layer located on said third dielectric layer; and a second conducting layer located on said fourth dielectric layer and said second dielectric layer.

13. The high-density trench power-MOSFET structure of claim 12, wherein the polarity of said substrate is N-type or P-type.

14. The high-density trench power-MOSFET structure of claim 12, wherein said first dielectric layer is a silicon layer and the polarity of said first dielectric layer is N-type or P-type.

15. The high-density trench power-MOSFET structure of claim 12, wherein said second dielectric layer is a silicon layer and the polarity of said first dielectric layer is N-type or P-type.

16. The high-density trench power-MOSFET structure of claim 12, wherein said substrate serves as a drain structure of said trench power-MOSFET.

17. The high-density trench power-MOSFET structure of claim 12, wherein said first conducting layer is a doped polysilicon, in-situ doped polysilicon, aluminum, copper, tungsten, titanium, platinum or an alloy.

18. The high-density trench power-MOSFET structure of claim 12, wherein said third dielectric layer is a silicon-nitride layer.

19. The high-density trench power-MOSFET structure of claim 12, wherein said fourth dielectric layer is a Phosphosilicate Glass (PSG) or a Borophosphosilicate Glass (BPSG).

20. The high-density trench power-MOSFET structure of claim 12, wherein a dopant polarity of said doped region is N-type or P-type.

21. The high-density trench power-MOSFET structure of claim 12, wherein a concentration of said doped region is between about $10^{15}$ and $7 \times 10^{15}/cm^3$.

* * * * *